(12) United States Patent
Kitagawa et al.

(10) Patent No.: US 12,184,206 B2
(45) Date of Patent: Dec. 31, 2024

(54) CONTROLLER FOR ROTARY ELECTRIC MACHINE

(71) Applicant: Mitsubishi Electric Corporation, Tokyo (JP)

(72) Inventors: Jun Kitagawa, Tokyo (JP); Tatsuya Mori, Tokyo (JP); Isao Kezobo, Tokyo (JP); Seiji Sawada, Tokyo (JP); Kenta Kubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 381 days.

(21) Appl. No.: 17/598,429

(22) PCT Filed: Jun. 4, 2019

(86) PCT No.: PCT/JP2019/022161
§ 371 (c)(1),
(2) Date: Sep. 27, 2021

(87) PCT Pub. No.: WO2020/230339
PCT Pub. Date: Nov. 19, 2020

(65) Prior Publication Data
US 2022/0166356 A1    May 26, 2022

(30) Foreign Application Priority Data

May 16, 2019    (JP) .................................. 2019-092703

(51) Int. Cl.
*H02P 21/18*    (2016.01)
*G01R 19/00*    (2006.01)
(Continued)

(52) U.S. Cl.
CPC .......... *H02P 21/18* (2016.02); *G01R 19/0092* (2013.01); *H02P 6/185* (2013.01); *H02P 23/14* (2013.01); *H02P 27/08* (2013.01)

(58) Field of Classification Search
CPC .......... H02P 21/18; H02P 6/185; H02P 23/14; H02P 27/08; H02P 6/183; G01R 19/0092
See application file for complete search history.

(56) References Cited

U.S. PATENT DOCUMENTS

2010/0194319 A1*  8/2010  Ito ........................... H02P 6/183
                                                        318/400.13
2010/0207555 A1*  8/2010  Ide ........................... H02P 21/32
                                                        318/400.02
(Continued)

FOREIGN PATENT DOCUMENTS

CN      105432010 A      3/2016
CN      106533302 A  *   3/2017    .............. H02P 21/05
(Continued)

OTHER PUBLICATIONS

Ryoso Masaki et al., "Position sensorless control for IPM motor based on Voltage injection Synchronized with PWM Carrier", TIEE Japan, 2002, pp. 37-44, vol. 122, No. 1.
(Continued)

*Primary Examiner* — Eman A Alkafawi
*Assistant Examiner* — Dilara Sultana
(74) *Attorney, Agent, or Firm* — Sughrue Mion, PLLC; Richard C. Turner

(57) ABSTRACT

To provide a controller for rotary electric machine which can suppress the increase in the switching frequency by the voltage for estimation while reducing the estimation delay of the magnetic pole position (the rotational angle). A controller for rotary electric machine turns on and off switching devices which the inverter has and applies voltage to the winding, based on a comparison result between the voltage command and the carrier wave; generates the voltage command for estimation of a preliminarily set one period on a stationary coordinate system fixed to the winding; generates the carrier wave of the same one period as the one period of
(Continued)

the voltage command for estimation; extracts the frequency component of the one period of the voltage command for estimation from the current detection value; and estimates a rotational angle based on the frequency component.

7 Claims, 9 Drawing Sheets

(51) Int. Cl.
*H02P 6/185* (2016.01)
*H02P 23/14* (2006.01)
*H02P 27/08* (2006.01)

(56) References Cited

U.S. PATENT DOCUMENTS

| | | | | |
|---|---|---|---|---|
| 2011/0248659 | A1* | 10/2011 | Balazovic | H02P 6/185 |
| | | | | 318/400.33 |
| 2013/0069572 | A1* | 3/2013 | Maekawa | H02P 6/18 |
| | | | | 318/400.14 |
| 2013/0342145 | A1* | 12/2013 | Kobayashi | H02P 6/183 |
| | | | | 318/400.33 |
| 2016/0011009 | A1 | 1/2016 | Shimizu et al. | |
| 2016/0111951 | A1* | 4/2016 | Taniguchi | H02M 7/44 |
| | | | | 363/41 |
| 2017/0201200 | A1* | 7/2017 | Hachiya | H02P 6/16 |
| 2017/0366126 | A1* | 12/2017 | Sinner | H02P 21/18 |
| 2018/0105201 | A1* | 4/2018 | Mori | H02P 23/00 |

FOREIGN PATENT DOCUMENTS

| | | | |
|---|---|---|---|
| EP | 3 007 345 | A1 | 4/2016 |
| JP | 2005-204403 | A | 7/2005 |
| JP | 2016-021800 | A | 2/2016 |
| JP | 6203435 | B2 | 9/2017 |
| JP | 2019-009875 | A | 1/2019 |
| KR | 10-2006-0095039 | A | 8/2006 |
| WO | 2016/129125 | A1 | 8/2016 |

OTHER PUBLICATIONS

Japanese Office Action of No. 2019-092703 dated Sep. 3, 2019.
International Search Report of PCT/JP2019/022161 dated Sep. 3, 2019 [PCT/ISA/210].
L. Accardo et al., "Sampling problems using Mixed Random Modulation Techniques (MRMT) for the reduction of magnetic noise in traction motors", SPEEDAM, 2008, International Symposium on Power Electronics, Electrical Drives, Automation and Motion, pp. 1199-1204.
Extended European Search Report dated Jun. 8, 2022, issued in European Application No. 19928989.3.
Chinese Office Action dated Sep. 1, 2023 in Application No. 201980096130.0.

* cited by examiner

CONTROLLER FOR ROTARY ELECTRIC MACHINE

CROSS REFERENCE TO RELATED APPLICATIONS

This application is a National Stage of International Application No. PCT/JP2019/022161 filed on Jun. 4, 2019, claiming priority based on Japanese Patent Application No. 2019-092703 filed on May 16, 2019.

TECHNICAL FIELD

The present disclosure relates to a controller for AC rotary electric machine.

BACKGROUND ART

In order to control the rotary electric machine precisely, the controller needs to control the power supply to the winding, based on the magnetic pole position information (the rotation angle information) of the rotor of the rotary electric machine. Previously, the magnetic pole position information of the rotor is obtained from the rotation sensor attached to the rotary electric machine. However, for installation of the rotation sensor, the cost rises, securing of installing space is required, and also management when abnormality occurs in the rotation sensor is required, and there are many disadvantages. Then, many sensorless magnetic pole position estimation methods which estimate the magnetic pole position information of the rotor without installing the rotation sensor are proposed.

There are mainly two methods in the sensorless magnetic pole position estimation methods. The first estimation method is the induced voltage method which estimates the magnetic pole position of the rotor by estimating the induced voltage of the rotary electric machine. The induced voltage method can estimate the magnetic pole position with good accuracy, when rotating to such an extent that the rotary electric machine generates the induced voltage. However, in the low rotational speed region where the induced voltage is not generated or the induced voltage is not almost generated, it is difficult to estimate the magnetic pole position.

The second estimation method is the superimposing high frequency method which estimates the magnetic pole position of the rotor using the saliency of the rotary electric machine. The superimposing high frequency method superimposes the high-frequency voltage for magnetic pole position estimation on the rotary electric machine, and estimates the magnetic pole position from the amplitude change of the current resulting from the positional dependence of inductance. Accordingly, it is possible to estimate also in the low rotational speed region.

However, in the superimposing high frequency method using saliency, since the high-frequency voltage is applied in order to estimate the magnetic pole position, there is a problem that noise according to the frequency of the high-frequency voltage occurs. For example, in PLT 1, the position estimate control uses the high-frequency voltage based on the dq-axis (alternation voltage) which rotates synchronizing with rotation of the rotor. Since this method uses the high-frequency voltage of one period equal to one period of the carrier wave (one triangular wave), it is easy to increase the frequency of the high-frequency voltage. That is to say, it is possible to reduce noise by setting the frequency of the high-frequency voltage outside the human audible range.

In PLT 2, the high-frequency voltage based on UVW-axis is used for the position estimate control. This method applies the voltage vector which rotates with the fixed period on the UVW-axis coordinate system which is a stationary coordinate system fixed to the stator winding of the rotary electric machine. And, by utilizing that the current amplitude of high frequency which is response of the high-frequency voltage has the positional dependence similar to the positional dependence of inductance, the magnetic pole position is estimated directly. Accordingly, unlike the first estimation method, it is not necessary to perform the PID control of the position error, and the response delay does not occur in estimation.

CITATION LIST

Patent Literature

PLT 1: JP 2016-21800 A
PLT 2: JP 6203435 B

SUMMARY OF INVENTION

Technical Problem

However, PLT 1 which uses the high-frequency voltage based on the dq-axis uses the observer including the PID control which uses the error A between the actual rotor position and the estimation position, for estimation of the magnetic pole position. That is to say, the latest estimation position is updated by feeding back the error A and integrating. Therefore, the position can be estimated only with the response less than or equal to the response frequency of the feedback which is set by the PID control gain. The response of the magnetic pole position estimation must be lowered rather than the response of the current control, and the response of position estimation cannot be made high.

On the other hand, the position estimating apparatus like PLT 2 uses the high-frequency voltage based on the UVW-axis of the rotary electric machine. As the waveform of the voltage command for position estimation (the high-frequency voltage command) is shown in FIG. 6 of PLT 2, the carrier waves of three triangular waves are required in order to generate the high-frequency voltage. Because, if the half period of the triangular wave is defined as one division, the output voltage changes only once in this half period in the PWM inverter. That is, if the one period of the high-frequency voltage is 360 degrees, in order to generate the high-frequency voltages of three-phase AC which have 120 degrees phase difference among phases, the high-frequency voltages need to be shifted by two divisions among phases, and to be set so that six divisions become one period. If the high frequency waveform is expressed by the simplest rectangular wave, rising and falling are repeated every 180 degrees. If 120 degrees phase difference is set among phases, the rising of each phase becomes 120-degree phase difference among phases, and the phase difference between the rising of a certain phase and the fallings of a different phase becomes 60 degrees.

Therefore, in the technology of PLT 2, it is necessary to divide the one period of the high-frequency voltage into six by 60 degrees, and six divisions are required. Accordingly, if the one division is the half period of the carrier wave of triangular shape, the carrier waves of three periods are required for the one period of the high-frequency voltage. As compared with the method of PLT 1, the carrier waves (the triangular waves) required for the one period of the high-frequency voltage is 3 times, and the switching frequency is also 3 times. That is to say, in the technology of PLT 2, if the frequency of the high-frequency voltage is increased in order to reduce the noise resulting from application of the high-frequency voltage, the switching frequency per unit time of the high-frequency voltage based on UVW-axis is more than that of the high-frequency voltage based on dq-axis, and the switching loss and the electromagnetic noise increase. The switching loss is energy loss which is caused at switching the switching device of the inverter, and the loss increases in proportion to the switching frequency. Accordingly, it is important in the viewpoint of energy saving. As the switching frequency per unit time becomes higher, the frequency of the electromagnetic noise becomes higher and the magnitude of the electromagnetic noise increases more. Accordingly, it is important in the viewpoint of EMI (electromagnetic interference). That is, it is important to lower the switching frequency.

From the above things, in the high-frequency voltage based on dq-axis of PLT 1, although the increase in the switching frequency by the high-frequency voltage can be suppressed, the response of position estimation is bad. In the high-frequency voltage based on UVW-axis of PLT 2, although the response of position estimation can be improved, the increase in the switching frequency by the high-frequency voltage is caused. Therefore, both technologies have the advantage and the disadvantage, and the advantage and the disadvantage have a trade-off relation mutually.

Thus, it is desirable to provide a controller for rotary electric machine which can suppress the increase in the switching frequency by the voltage command for estimation while reducing the estimation delay of the magnetic pole position (the rotational angle).

Solution to Problem

A controller for rotary electric machine of the present disclosure which controls a rotary electric machine which has saliency in a rotor via an inverter, the controller for rotary electric machine including:
a current detection unit that detects current which flow into a winding provided in a stator of the rotary electric machine;
an angle estimation unit that estimates a rotational angle of the rotor, based on current detection value;
a current control unit that calculates a driving voltage command for driving the rotary electric machine, based on the current detection value;
a command for estimation generation unit that generates a voltage command for estimation;
a voltage command calculation unit that calculates a voltage command by adding the voltage command for estimation to the driving voltage command;
a carrier generation unit that generates a carrier wave; and
a voltage application unit that turns on and off switching devices which the inverter has and applies voltage to the winding, based on a comparison result between the voltage command and the carrier wave,
wherein the command for estimation generation unit generates the voltage command for estimation of a preliminarily set one period on a stationary coordinate system fixed to the winding,
wherein the carrier generation unit generates the carrier wave of the same one period as the one period of the voltage command for estimation, and
wherein the angle estimation unit extracts a frequency component of the one period of the voltage command for estimation, from the current detection value, and estimates the rotational angle based on the frequency component.

Advantage of Invention

According to the controller for rotary electric machine of the present disclosure, since the one period of the voltage command for estimation and the one period of the carrier wave are the same periods, the switching frequency per the one period of the voltage command for estimation can be reduced. Therefore, the switching loss and the electromagnetic noise caused by switching can be reduced. In addition, since the voltage command for estimation is generated on the stationary coordinate system fixed to the winding, by utilizing the magnetic pole position dependence of inductance of the rotor which has saliency, the frequency component of the one period of the voltage command for estimation is extracted from the current detection value, the rotational angle can be estimated directly based on the frequency component, and the estimation delay can be reduced.

DETAILED DESCRIPTION OF THE EMBODIMENTS

1. Embodiment 1

Figure 1:
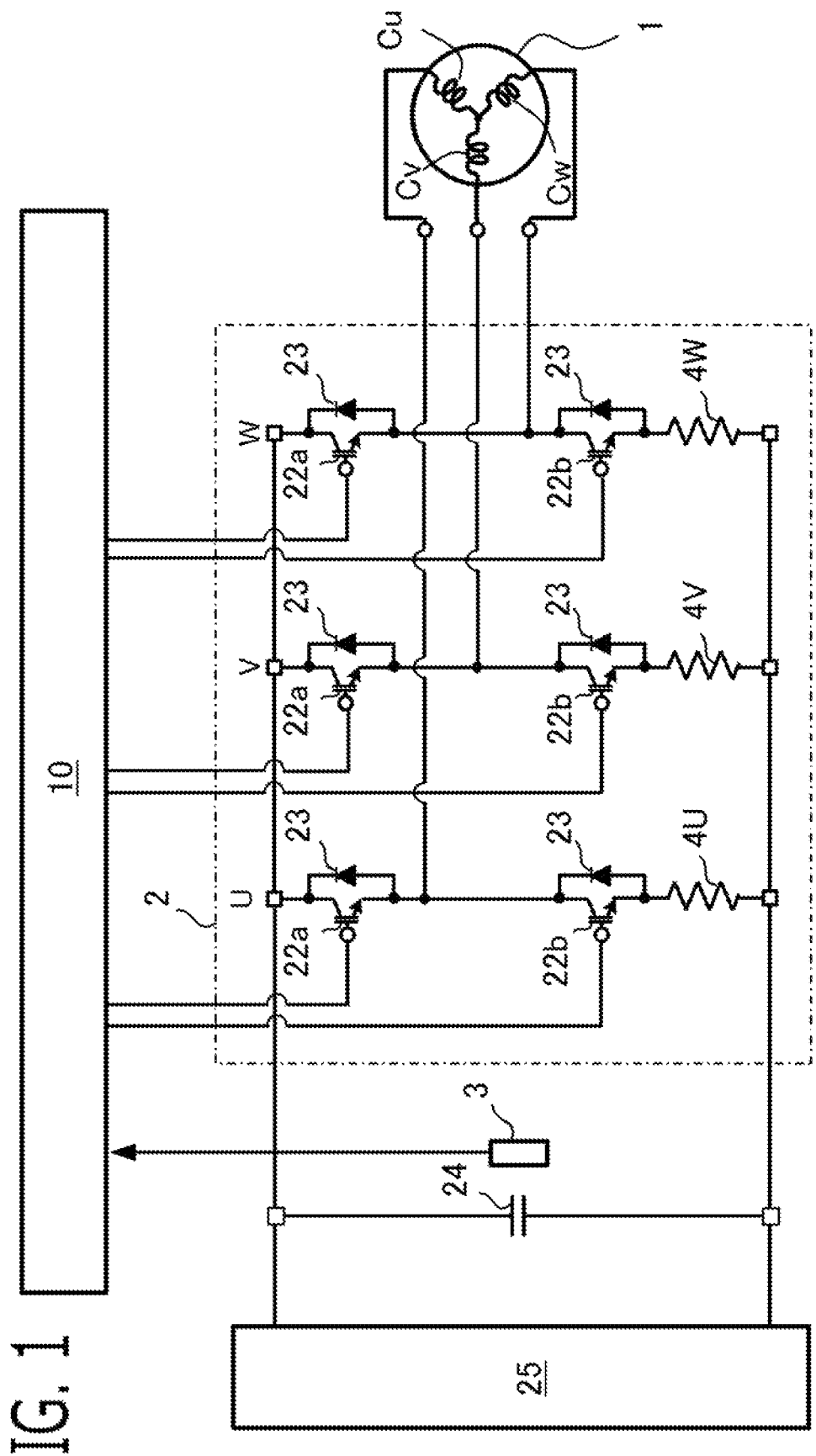
FIG. 1 is a schematic configuration diagram of the rotary electric machine, the inverter, and the controller for rotary electric machine according to Embodiment 1.

A controller 10 for rotary electric machine (hereinafter, referred to simply as the controller 10) according to Embodiment 1 will be explained with reference to drawings. FIG. 1 is a schematic configuration diagram of a rotary electric machine 1, an inverter 2, and the controller 10 according to the present embodiment.

1-1. Rotary Electric Machine

The rotary electric machine 1 is a permanent magnet synchronous rotary electric machine which is provided with a stator having three-phase windings Cu, Cv, Cw of U phase, V phase, and W phase, and a rotor having a permanent magnet. The three-phase windings Cu, Cv, Cw are connected by star connection. The three-phase windings may be connected by delta connection. The rotor has saliency, and d-axis inductance is different from q-axis inductance. For example, the rotary electric machine 1 is an embedded magnet synchronous rotary electric machine in which the permanent magnet is embedded inside the rotor.

1-2. Inverter

The inverter 2 is provided with a plurality of switching devices and performs a DC/AC conversion between a DC power source 25 and the three-phase windings. The inverter 2 is provided with three sets of a series circuit where a positive electrode side switching device 22a connected to the positive electrode side of the DC power source 25 and a negative electrode side switching device 22b connected to the negative electrode side of the DC power source 25 are connected in series, corresponding to respective phases of the three-phase windings. The inverter 20 is provided with a total of six switching devices of the three positive electrode side switching devices 22a, and the three negative electrode side switching devices 22b. Then, a connection node where the positive electrode side switching device 22a and the negative electrode side switching device 22b are connected in series is connected to the winding of the corresponding phase.

IGBT (Insulated Gate Bipolar Transistor) in which a diode 23 is connected in inverse parallel, MOSFET (Metal Oxide Semiconductor Field Effect Transistor) which has a function of diode connected in inverse parallel, or the like is used for the switching device. A gate terminal of the each switching device is connected to the controller 10. Each switching device is turned on and off by PWM control signals SWu, SWv, SWw outputted from the controller 10.

A smoothing capacitor 24 is connected between the positive electrode side and the negative electrode side of the inverter 2. A voltage sensor 3 outputs an electric signal according to a DC voltage of the DC power source 25. The output signal of the voltage sensor 3 is inputted into the controller 10.

The inverter 2 is provided with a current sensor 4 for detecting current which flows into the winding. In the present embodiment, the current sensor 4 is provided on the series circuit of the positive electrode side switching device 22a and the negative electrode side switching device 22b. In this example, the shunt resistance 4U, 4V, 4W of each phase is connected in series to the negative electrode side of the negative electrode side switching device 22b on the series circuit of each phase. The both-ends potential difference of the shunt resistance 4U, 4V, 4W of each phase is inputted into the control circuit 4. The shunt resistance 4U, 4V, 4W of each phase may be connected in series to the positive electrode side of the positive electrode side switching device 22a on the series circuit of each phase. Alternatively, the current sensor 4 may be a Hall element or the like provided on the each phase wire which connects the series circuit of the switching devices and the winding.

A chargeable and dischargeable electricity accumulation device (for example, a lithium ion battery, a nickel hydride battery, an electrical double layer capacitor) is used for the DC power source 25. A DC-DC converter which is a DC electric power converter which steps up or steps down the DC voltage may be provided in the DC power source 25.

1-3. Controller

Figure 2:
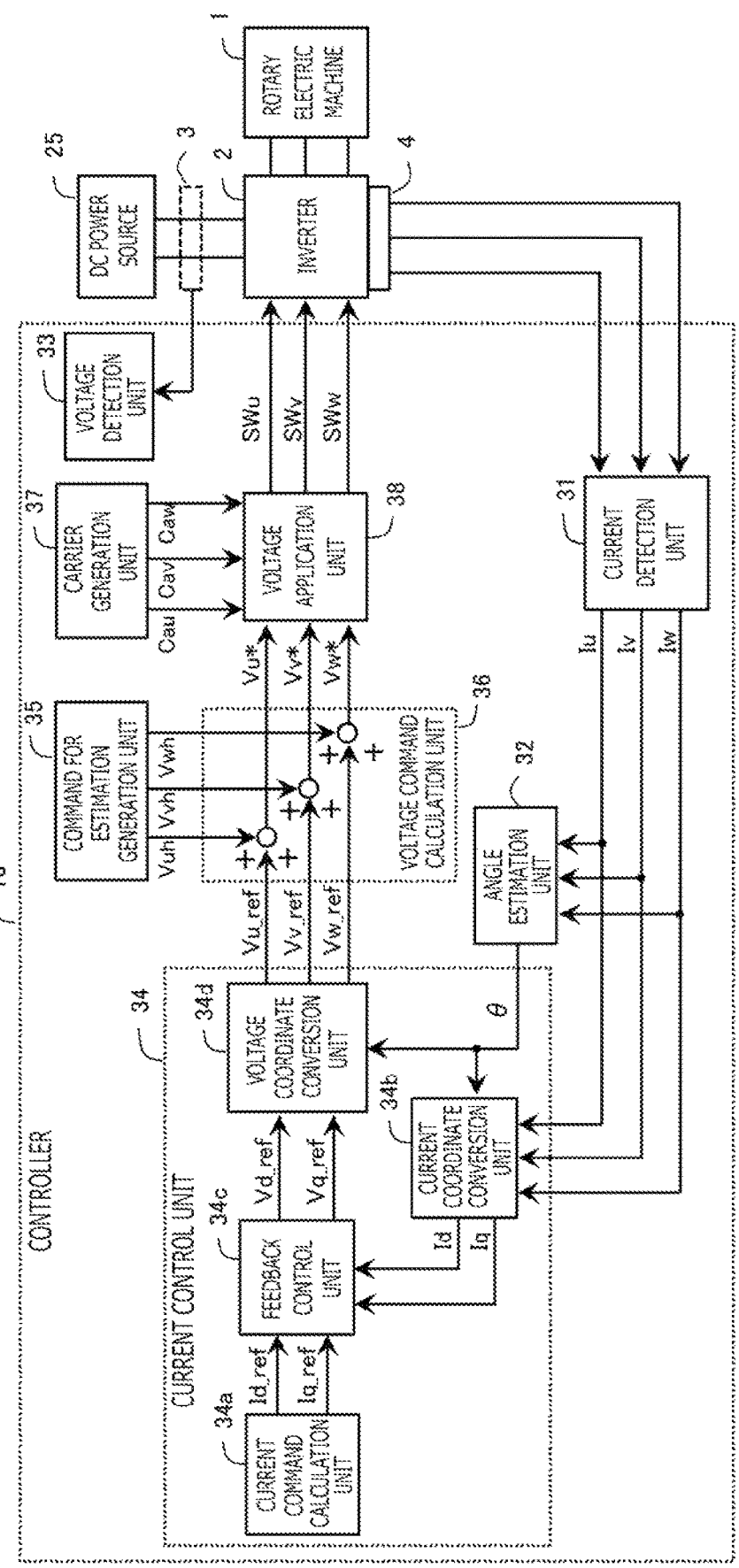
FIG. 2 is a schematic block diagram of the controller for rotary electric machine according to Embodiment 1.
Figure 3:
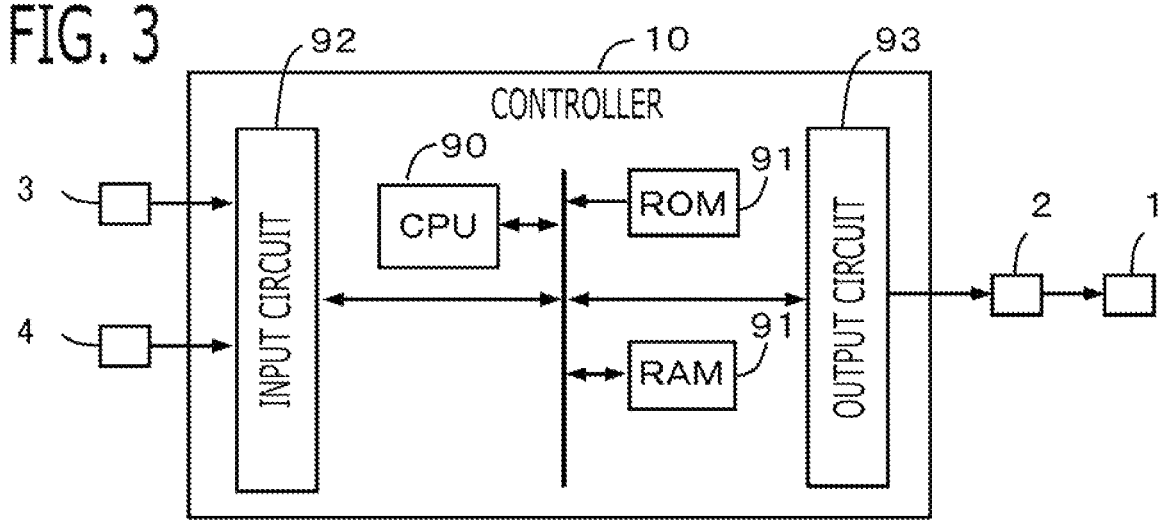
FIG. 3 is a hardware configuration diagram of the controller for rotary electric machine according to Embodiment 1.

The controller 10 controls the rotary electric machine 1 via the inverter 2. As shown in FIG. 2, the controller 10 is provided with a current detection unit 31, an angle estimation unit 32, a voltage detection unit 33, a current control unit 34, a command for estimation generation unit 35, a voltage command calculation unit 36, a carrier generation unit 37, a voltage application unit 38, and the like. Each function of the controller 10 is realized by processing circuits provided in the controller 10. Specifically, as shown in FIG. 3, the controller 10 is provided with, as a processing circuit, an arithmetic processor (computer) 90 such as a CPU (Central Processing Unit), storage apparatuses 91 that exchange data with the arithmetic processor 90, an input circuit 92 that inputs external signals to the arithmetic processor 90, an output circuit 93 that outputs signals from the arithmetic processor 90 to the outside, and the like.

As the arithmetic processor 90, ASIC (Application Specific Integrated Circuit), IC (Integrated Circuit), DSP (Digital Signal Processor), FPGA (Field Programmable Gate Array), various kinds of logical circuits, various kinds of signal processing circuits, and the like may be provided. As the arithmetic processor 90, a plurality of the same type ones or the different type ones may be provided, and each processing may be shared and executed. As the storage apparatuses 91, there are provided a RAM (Random Access Memory) which can read data and write data from the arithmetic processor 90, a ROM (Read Only Memory) which can read data from the arithmetic processor 90, and the like. The input circuit 92 is connected with various kinds of sensors and switches such as the voltage sensor 3 and the current sensor 4, and is provided with A/D converter and the like for inputting output signals from the sensors and the switches to the arithmetic processor 90. The output circuit 93 is connected with electric loads such as a gate drive circuit which drive on/off of the switching devices, and is provided with a driving circuit and the like for outputting a control signal from the computing processing unit 90.

Then, the arithmetic processor 90 runs software items (programs) stored in the storage apparatus 91 such as ROM and collaborates with other hardware devices in the controller 10, such as the storage apparatus 91, the input circuit 92, and the output circuit 93, so that the respective functions of the control units 31 to 38 of FIG. 2 provided in the controller 10 are realized. Various kinds of setting data items to be utilized in the control units 31 to 38 are stored, as part of software items (programs), in the storage apparatus 91 such as ROM. Each function of the controller 10 will be explained in detail below.

1-3-1. Each Detection Unit

The voltage detection unit 33 detects a power source voltage VDC of the DC power source 25. In the present embodiment, the voltage detection unit 33 detects the power source voltage VDC based on the output signal of the voltage sensor 3.

The current detection unit 31 detects winding currents Iu, Iv, Iw which flow into the three-phase windings. In the present embodiment, the current detection unit 31 detects currents Iu, Iv, Iw which flow into the respective phase windings Cu, Cv, Cw from the inverter 2, based on the output signal of the current sensor 4.

In the present embodiment, the current sensor 4 is provided on the negative electrode side of the negative electrode side switching device 22b on the series circuit of each phase. It is necessary to detect current at the timing when the negative electrode side switching device 22b is turned on and current flowed into the current sensor 4. Then, about each phase, the current detection unit 31 detects current based on the output signal of the current sensor, when the negative electrode side switching device 22b is turned on. In the present embodiment, the current detection unit 31 detects the current of each phase Iu, Iv, Iw based on the output signal of the current sensor 4 of each phase, at the peak point of mountain of the carrier wave of each phase. Due to influence of ringing by switching and processing order of the arithmetic processor 90, current detection may be executed with a time delay of several microseconds to several tens microseconds after the peak point of mountain.

If the current sensor 4 is provided on the positive electrode side of the positive electrode side switching device 22a on the series circuit of each phase, the current detection unit 31 may detect current based on the output signal of the current sensor, when the positive electrode side switching device 22a is turned on, about each phase, and the current detection unit 31 may detect the current of each phase Iu, Iv, Iw based on the output signal of the current sensor 4 of each phase, at the bottom point of valley of the carrier wave of each phase.

1-3-2. Current Control Unit

The current control unit 34 calculates a driving voltage command for driving the rotary electric machine 1, based on the current detection value. The current control unit 34 is provided with a current command calculation unit 34a, a current coordinate conversion unit 34b, a feedback control unit 34c, and a voltage coordinate conversion unit 34d.

The current command calculation unit 34a calculates a current command of d-axis Id_ref and a current command of q-axis Iq_ref. Well-known current vector control methods, such as the maximum torque/current control, the magnetic flux weakening control, and the Id=0 control, are used for calculation of the current commands of dq-axis Id_ref, Iq_ref.

The current coordinate conversion unit 34b calculates a current detection value of d-axis Id and a current detection value of q-axis Iq by performing a three-phase/two-phase conversion and a rotating coordinate conversion to the current detection values Iu, Iv, Iw of three-phase based on the magnetic pole position θ estimated by the angle estimation unit 32 described below. The d-axis is defined in the direction of the N pole (the magnetic pole position) of the permanent magnet provided in the rotor, and the q-axis is defined in the direction advanced to d-axis by 90 degrees (π/2) in the electrical angle.

The feedback control part 34c calculates current deviations between the current commands of dq-axis Id_ref, Iq_ref and the current detection values of dq-axis Id, Iq, and calculates a driving voltage command of d-axis Vd_ref and a driving voltage command of q-axis Vq_ref by performing a control calculation, such as PID control based on the current deviations.

The voltage coordinate conversion unit 34d calculates a driving voltage command of U phase Vu_ref, a driving voltage command of V phase Vv_ref, and a driving voltage command of W phase Vw_ref by performing a fixed coordinate conversion and a two-phase/three-phase conversion to the driving voltage commands of dq-axis Vd_ref, Vq_ref based on the magnetic pole position θ. The main components of the driving voltage commands of three-phase Vu_ref, Vv_ref, Vw_ref are AC voltages (sine wave) of three-phase for driving the rotary electric machine 1, and are called as fundamental waves. The fundamental waves have the same period as one period of the rotary electric machine in the electrical angle.

1-3-3. Command for Estimation Generation Unit

The command for estimation generation unit 35 generates a voltage command for estimation of a preliminarily set one period Th on a stationary coordinate system fixed to the winding. The frequency fh of the one period Th of the voltage command for estimation is higher than the frequency of the driving voltage commands of three-phase (the fundamental waves).

<Setting of Frequency>

In the present embodiment, the frequency fh of the one period Th of the voltage command for estimation is set to greater than or equal to 18000 Hz. The frequency fh is a reciprocal of the one period Th of the voltage command for estimation (fh=1/Th). Accordingly, the frequency fh of the voltage command for estimation can be set to greater than or equal to the human audible range (18000 Hz), and the noise which is generated by superimposing the voltage command for estimation on the voltage command can be lowered.

<Phase Difference Among Phases>

Figure 4:
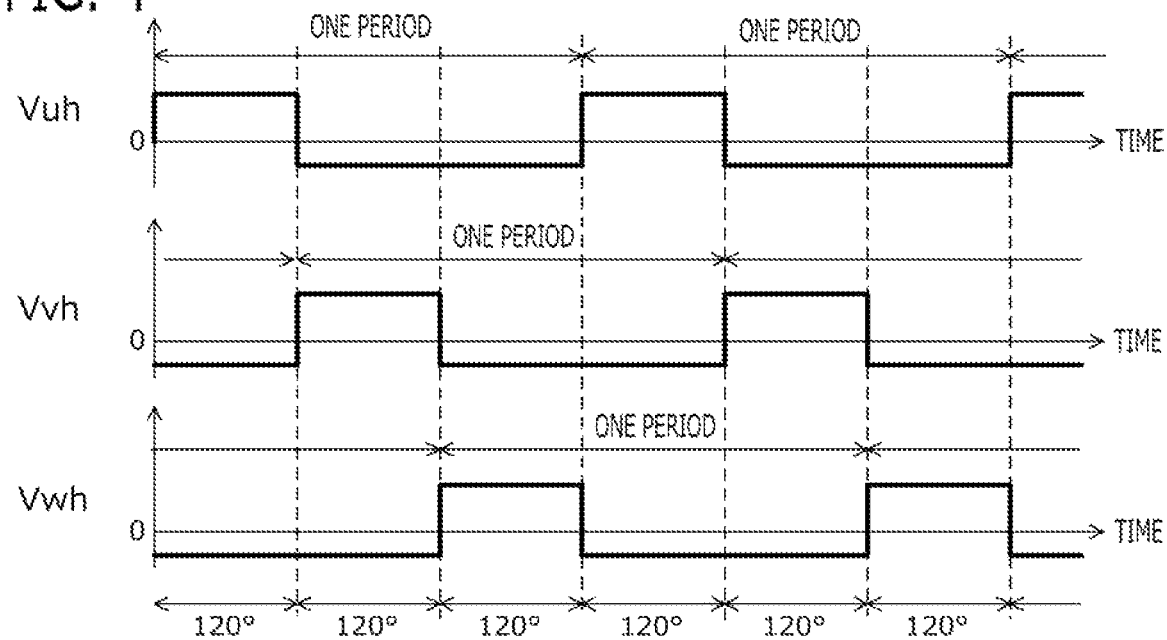
FIG. 4 is a time chart of the voltage commands for estimation of three-phase according to Embodiment 1.

In the present embodiment, as shown in FIG. 4, the command for estimation generation unit 35 generates the three voltage commands for estimation Vuh, Vvh, Vwh corresponding to respective phases of three-phase. The voltage commands for estimation of three-phase Vuh, Vvh, Vwh have a mutual phase difference of ⅓ of the one period of the voltage command for estimation, among phases. That is to say, if the one period Th of the voltage command for estimation is 360 degrees, the voltage command for estimation of V phase Vvh has 120 degrees phase delay to the voltage command for estimation of U phase Vuh, the voltage command for estimation of W phase Vwh has 120 degrees phase delay to the voltage command for estimation of V phase Vvh, and the voltage command for estimation of U phase Vuh has 120 degrees phase delay to the voltage command for estimation of W phase Vwh. The voltage commands for estimation of three-phase Vuh, Vvh, Vwh are the same waveforms having the mutual phase difference.

<Three Divisions of One Period>

Although the voltage command for estimation may be cosine wave (or sine wave), the processing load increases in order to generate the cosine wave of high frequency. Then, it is desirable to generate the voltage commands for estimation which have a mutual 120 degrees phase difference among phases, and have a component of the predetermined frequency fh, while reducing the processing load.

In the present embodiment, in order to provide the mutual 120 degrees phase difference, the one period Th is equally divided into three which is the necessary minimum division number. Then, in the three division periods, each of the voltage commands for estimation is set so that the values of at least two division periods are different with each other. In the present embodiment, in the three division periods, each of the voltage commands for estimation is set so that the values of two division periods are different with each other. Accordingly, each of the voltage commands for estimation is set so that the value of one division period and the values of the remaining two division periods are different with each other. Each division period is 120 degrees period, and the voltage commands for estimation are shifted by one division period mutually among phases.

In this way, each of the voltage commands for estimation becomes two different values in the one period Th, and have a component of the frequency fh of this one period Th. Accordingly, the component of the frequency fh of the voltage command for estimation can be generated in the current flowing through the winding, and the rotational angle can be estimated based on the current detection value. Becoming two different values in the one period is the minimum requirement of the voltage command for estimating the rotational angle, and the processing load for generating the voltage command for estimation can be minimized. Like Embodiment 2 described below, each of the voltage commands for estimation may become three or more values in the one period Th.

As shown in the next equation, at each time, it is set so that a total value of the voltage commands for estimation of three-phase Vuh, Vvh, Vwh becomes 0, and it becomes a three-phase equilibrium. And, it is set so that an integral value of each of the voltage commands for estimation in the one period becomes 0.

$$Vuh+Vvh+Vwh=0 \qquad (1)$$

Each of the voltage commands for estimation may be offset, and the total value of the voltage commands for estimation of three-phase Vuh, Vvh, Vwh may be offset from 0.

<Relationship Between Voltage Command for Estimation and Frequency Component of Current>

Herein, if it is assumed that a component of the frequency fh of the voltage command for estimation included in the voltage command for estimation is a cosine wave with an amplitude B, there is a relationship of the next equation among the voltage command for estimation Vh(t), a component Ih of the frequency fh of the voltage command for estimation included in the AC current which flows into the winding, and an amplitude A of the frequency component Ih of current.

$$\begin{aligned} Ih(t) &= A \times \sin(\omega h \times t) \\ Vh(t) &= B \times \cos(\omega h \times t) \\ &= L \times dIh(t)/dt \\ A &= B/(L \times \omega h) \end{aligned} \qquad (2)$$

Herein, ωh is an angular frequency of the voltage command for estimation, t is time, and L is an inductance of the rotary electric machine. The angular frequency ωh of the voltage command for estimation is a value obtained by dividing 2π by the one period Th of the voltage command for estimation.

Since there is saliency, the inductance L changes according to the magnetic pole position θ, and there is a predetermined relationship between the inductance L and the magnetic pole position θ. Accordingly, it is understood from the third equation of the equation (2) that the magnetic pole position θ can be estimated based on the amplitude A of the frequency component Ih of the voltage command for estimation included in current.

<Noise Resistance of the Current Detection Value>

As the amplitude A of the frequency component Ih of the voltage command for estimation included in current becomes larger, the tolerance to a noise superimposed on the current detection value becomes higher. From the third equation of the equation (2), in order to increase the amplitude A of the frequency component Ih, the inductance L may be decreased, the angular frequency ωh of the voltage command for estimation may be decreased, or the amplitude B of voltage command for estimation may be increased. Since the inductance L is related to the design of the rotary electric machine, it is not easy to adjust. If the angular frequency ωh of the voltage command for estimation is decreased, noise becomes larger, and it is not desirable. On the other hand, if the amplitude B of the voltage command for estimation is increased too much, since the voltage command after superimposing the voltage command for estimation exceeds the limitation (+VDC/2 to −VDC/2) of the power source voltage VDC, there is an upper limit in the increase of the amplitude B of the voltage command for estimation.

It is desirable to set the voltage commands for estimation of three-phase Vuh, Vvh, Vwh based on these things, and increase the noise resistance of the amplitude A of the frequency component Ih of the voltage command for estimation included in current. For example, in the operating region of the rotary electric machine where the angle estimation is performed using the voltage command for estimation, on the operating condition where the amplitude of the driving voltage commands of three-phase becomes the maximum, the maximum value of the amplitude of the voltage command for estimation which becomes within the limitation of the power source voltage VDC may be set to the amplitude of the voltage command for estimation. Alternatively, a value which can secure the noise resistance although it is smaller than the maximum value of the amplitude of the voltage command for estimation which becomes within the limitation of the power source voltage VDC may set to the amplitude of the voltage command for estimation.

1-3-4. Voltage Command Calculation Unit

The voltage command calculation unit 36 calculates a voltage command by adding the voltage command for estimation to the driving voltage command. In the present embodiment, as shown in the next equation, the voltage command calculation unit 36 calculates the voltage commands of three-phase Vu*, Vv*, Vw* by adding the voltage commands for estimation of three-phase Vuh, Vvh, Vwh to the driving voltage commands of three-phase Vu_ref, Vv_ref, Vw_ref, respectively.

$$Vu^*=Vu\_ref+Vuh$$

$$Vv^*=Vv\_ref+Vvh$$

$$Vw^*=Vw\_ref+Vwh \qquad (3)$$

1-3-5. Carrier Generation Unit

The carrier generation unit 37 generates a carrier wave of the same one period Th as the one period Th of the voltage command for estimation. The carrier wave vibrates with an amplitude of the power source voltage VDC/2 centering on 0.

<Phase Difference Among Phases>

Figure 5:
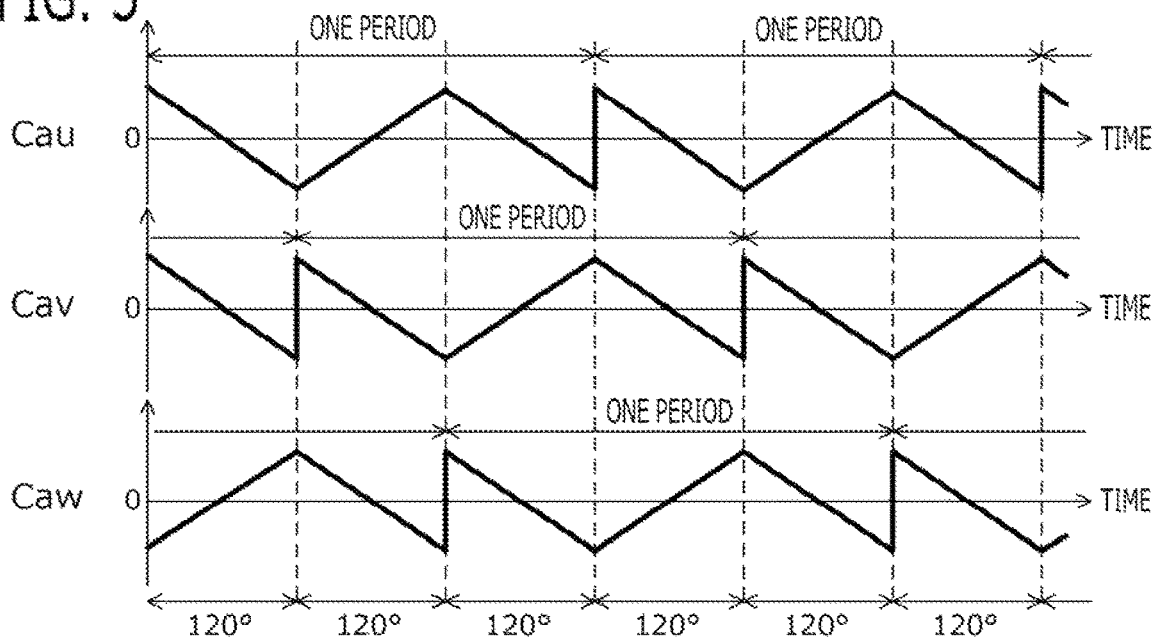
FIG. 5 is a time chart of the carrier waves of three-phase according to Embodiment 1.

In the present embodiment, as shown in FIG. 5, the carrier generation unit 37 generates the three carrier waves Cau, Cav, Caw corresponding to respective phases of three-phase. The carrier waves of three-phase Cau, Cav, Caw have a mutual phase difference of ⅓ of the one period Th of the carrier wave among phases. That is to say, if the one period Th of the carrier wave is 360 degrees, the carrier wave of V phase Cav has 120 degrees phase delay to the carrier wave of U phase Cau, the carrier wave of W phase Caw has 120 degrees phase delay to the carrier wave of V phase Cav, and the carrier wave of U phase Cau has 120 degrees phase delay to the carrier wave of W phase Caw. The carrier waves of three-phase Cau, Cav, Caw are the same waveforms having the mutual phase difference.

The voltage command that the voltage command for estimation was added is compared with the carrier wave, and the PWM control signal which turns on and off the switching devices is generated. Accordingly, by providing the mutual phase difference among phases also in the carrier waves similar to the voltage commands for estimation, the mutual phase difference among phases can be provided also in the PWM control signals of the comparison results, and many information on the mutual phase difference of the voltage commands for estimation can be left in the PWM control signals. Therefore, the frequency component Ih of the voltage command for estimation required for the angle estimation can be effectively superimposed on the winding current of each phase.

<Waveform of Carrier Wave>

As shown in FIG. 5, the carrier generation unit 37 generates a triangular wave of 1.5 periods which starts from the peak point of mountain and ends at the bottom point of valley, as the carrier wave of the one period Th. The carrier generation unit 37 may generate a triangular wave of 1.5 periods which starts from the bottom point of valley and ends at the peak point of mountain, as the carrier wave of the one period Th.

As mentioned above, although the current detection unit 31 detects the current of each phase Iu, Iv, Iw at the peak point of the mountain of the carrier wave of each phase, two peak points of mountain of the carrier wave exist in the one period Th of the voltage command for estimation. Accordingly, the current detection unit 31 can detect current twice in the one period Th of the voltage command for estimation. Therefore, it is easy to detect the amplitude A of the frequency component Ih of the voltage command for estimation included in current.

1-3-6. Voltage Application Unit

The voltage application unit 38 applies voltage to the winding, based on the comparison result of the voltage command and the carrier wave. The voltage application unit 38 applies voltage to the winding by turning on and off plural switching devices which the inverter 2 has.

Figure 6:
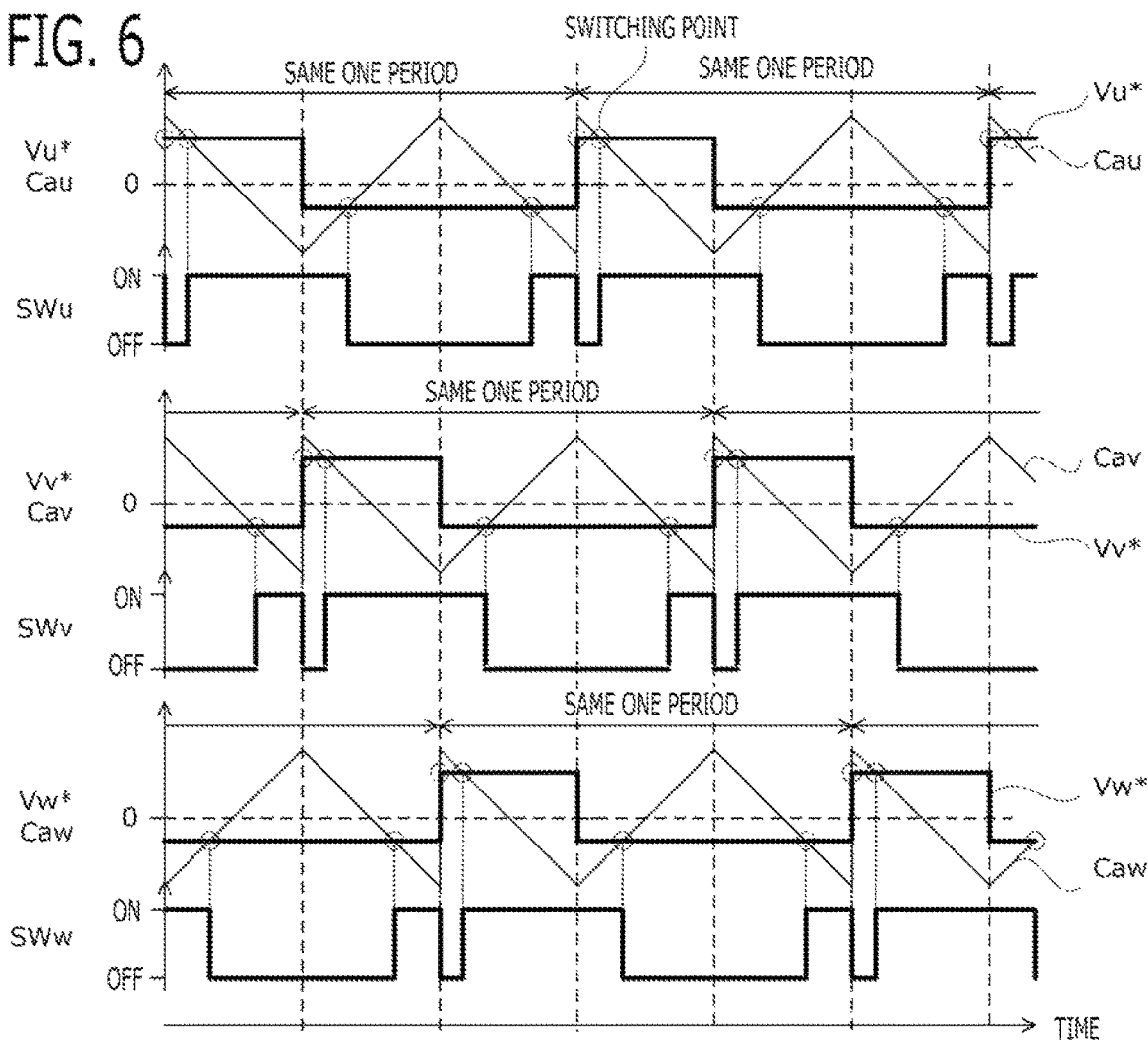
FIG. 6 is a time chart for explaining generation of the PWM control signal by comparing the voltage command for estimation with the carrier wave according to Embodiment 1.

The voltage application unit 38 compares the voltage commands of three-phase Vu*, Vv*, Vw* with the carrier waves of three-phase Cau, Cav, Caw, respectively, and generates the PWM control signals of three-phase SWu, SWv, SWw. As shown in FIG. 6, about each phase, the voltage application unit 38 turns on the PWM control signal, when the voltage command exceeds the carrier wave, and turns off the PWM control signal, when the voltage command is below the carrier wave. The voltage application unit 38 outputs the PWM control signals of three-phase SWu, SWv, SWw to the inverter 2. About each phase, when the PWM control signal is ON, the positive electrode side switching device 22a is turned on, and the negative electrode side switching device 22b is turned off; and when the PWM control signal is OFF, the positive electrode side switching device 22a is turned off, and the negative electrode side switching device 22b is turned on.

FIG. 6 shows an example of generation of the PWM control signals of three-phase SWu, SWv, SWw. Herein, the driving voltage commands of three-phase Vu_ref, Vv_ref, Vw_ref are set to 0, and the voltage commands of three-phase Vu*, Vv*, Vw* become equal to the voltage commands for estimation of three-phase Vuh, Vvh, Vwh. As round marks show points at which the switching devices are switched, about each phase, the switching is performed 4 times in the one period Th of the voltage command for estimation. In the technology of PLT 2, the switching is performed 6 times in the one period of the voltage for position estimation. In the present embodiment, it can be decreased to ⅔, and the switching loss and the electromagnetic noise which is generated by the switching can be reduced.

Since the mutual phase difference among phases is provided also in the carrier waves of three-phase similar to the voltage commands for estimation of three-phase, the waveforms of the PWM control signals of three-phase become the same waveforms having the mutual phase difference. Therefore, even with small switching frequency, many information on the mutual phase difference of the voltage commands for estimation of three-phase can be left in the PWM control signals of three-phase.

<Relationship Between Voltage Command for Estimation and Carrier Wave>

Herein, the relationship between the voltage commands for estimation of three-phase Vuh, Vvh, Vwh, and the carrier waves of three-phase Cau, Cav Caw will be explained. As mentioned above, one period of the voltage for position estimation used in PLT 2 is 3 times of one period of the carrier wave (FIG. 6 of PLT 2). Accordingly, the switching is performed 6 times in the one period of the voltage for position estimation. As mentioned above, when the frequency of the voltage command for estimation is increased, it is desirable from viewpoints of switching loss and the like to reduce the switching frequency in the one period Th of the voltage command for estimation. Then, the voltage commands for estimation of three-phase Vuh, Vvh, Vwh are set as FIG. 4 so that the switching frequency in the one period Th of the voltage command for estimation is reduced.

On the other hand, if only the switching frequency in the one period Th of the voltage command for estimation is reduced, the waveform of the carrier wave may be set to be the same as the conventional triangular wave, and only the voltage command for estimation may be set to the waveform of FIG. 4. However, in order to detect current twice in the one period Th of the voltage command for estimation, it is necessary to set the one period of the triangular wave to two times of the one period Th of the voltage command for estimation, and the one period of the PWM control signal becomes two times of the one period Th of the voltage command for estimation, and a frequency component of ½ times of the frequency fh of the voltage command for estimation is superimposed on current. Accordingly, even if the frequency fh of the voltage command for estimation is set to greater than or equal to the human audible range, the frequency below it is generated and noise cannot be reduced enough.

On the other hand, in the present embodiment, as shown in FIG. 6, since the one period of the carrier wave is set to the same period as the one period Th of the voltage command for estimation, the one period of the PWM control signal can also be made the same as the one period Th of the voltage command for estimation, it can be suppressed that the frequency component less than or equal to the human audible range is superimposed on current, and the noise due to superposition of the voltage command for estimation can be reduced.

1-3-7. Angle Estimation Unit

The angle estimation unit 32 estimates the rotational angle θ (the magnetic pole position θ) in the electrical angle of the rotor, based on the current detection value. The angle estimation unit 32 extracts the frequency component Ih of the one period Th of the voltage command for estimation from the current detection value, and estimates the rotational angle θ (the magnetic pole position θ), based on the frequency component Ih.

As explained using the third equation of the equation (2), by utilizing that the amplitude A of the frequency component Ih of the voltage command for estimation included in current changes according to the inductance L which changes according to the magnetic pole position θ, the magnetic pole position θ is estimated. Since the rotor has saliency, the inductance L on the stationary coordinate system changes according to the magnetic pole position θ, and there is the predetermined relationship between the inductance L and the magnetic pole position θ.

<Current Detection Timing>

Figure 7:
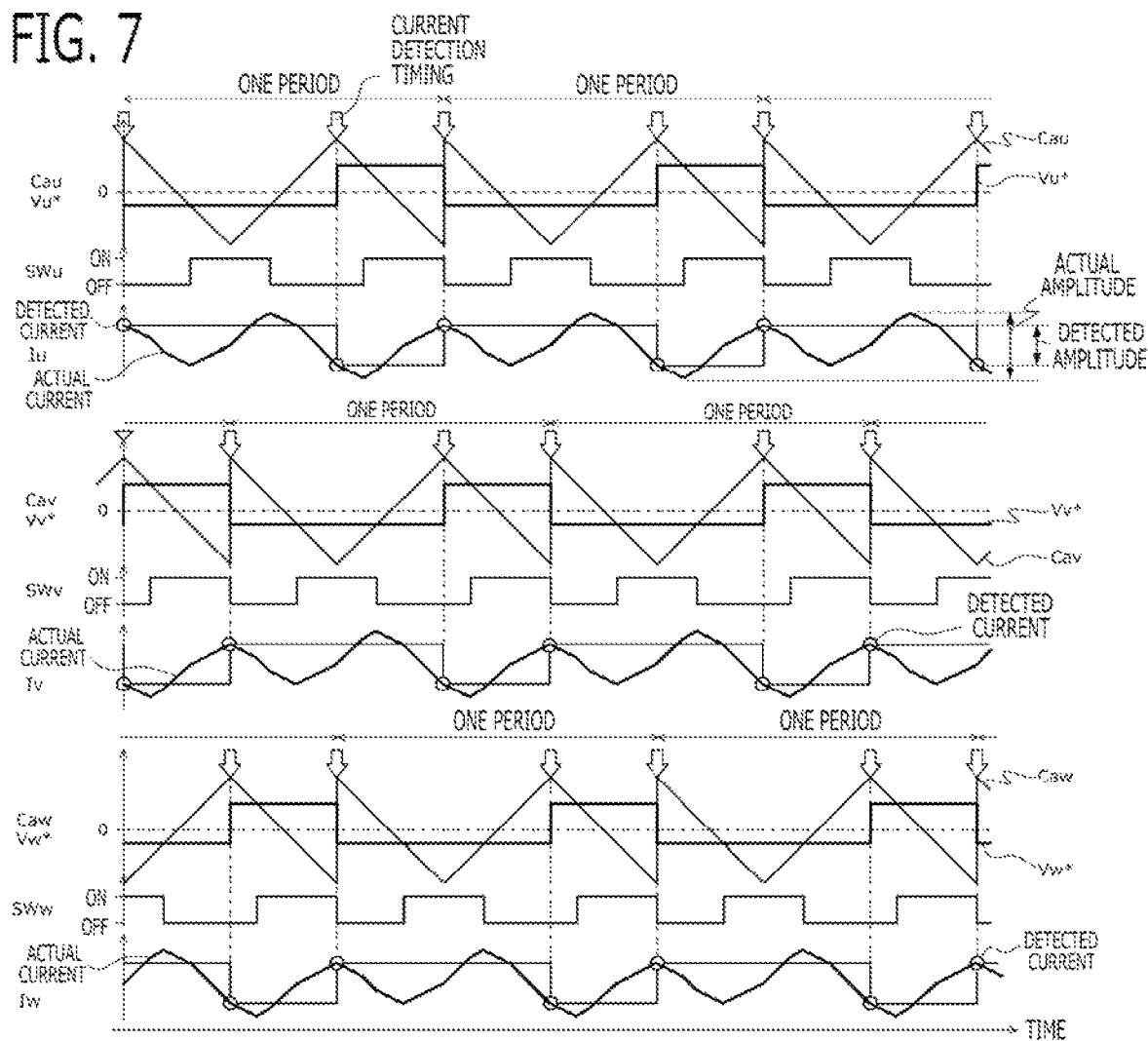
FIG. 7 is a time chart for explaining the voltage command for estimation, the carrier wave, and the behavior of current detection value according to Embodiment 1.

The current detection according to the present embodiment will be explained using FIG. 7. In the example of FIG. 7, as compared with the example of FIG. 6, the carrier waves of three-phase Cau, Cav, Caw are shifted by ⅓ periods with respect to the voltage commands for estimation of three-phase Vuh, Vvh, Vwh.

As mentioned above, the current sensor 4 is provided on the negative electrode side of the negative electrode side switching device 22b, and the current detection is executed at the peak point of mountain of the carrier wave where the negative electrode side switching device 22b becomes ON. Within the one period Th of the voltage command for estimation, two peak points of mountain of the carrier wave exist. As long as it is a period when the PWM control signal becomes OFF and the negative electrode side switching device 22b becomes ON, also at a timing other than the peak point of mountain of the carrier wave, current may be detected, and the current detection frequency may be increased.

Alternatively, by utilizing that the total value of the currents of three-phase Iu, Iv, Iw becomes 0 (Iu+Iv+Iw=0), the current detection value of one remaining phase may be calculated based on the current detection values of two phases. For example, even at the time point when the carrier wave of U phase Cau is at the bottom point of valley and the current of U phase Iu cannot be detected, the carrier wave of V phase Cav and the carrier wave of W phase Caw are at the peak point of mountain, and the current of V phase Iv and the current of W phase Iw are detected. Then, a value obtained by multiplying −1 to a total value of the current detection value of V phase Iv and the current detection value of W phase Iw is calculated as the current detection value of U phase Iu. Accordingly, the current detection frequency of the one period Th can be increased to 3 times.

<Detailed Configuration of Angle Estimation Unit>

In the present embodiment, the angle estimation unit 32 calculates the amplitude A of the frequency component Ih of the voltage command for estimation included in current, based on the current detection values which are detected at least twice (in this example, twice) in the one period Th of the voltage command for estimation, and estimates the rotational angle θ (the magnetic pole position θ) based on the amplitude A.

Figure 8:
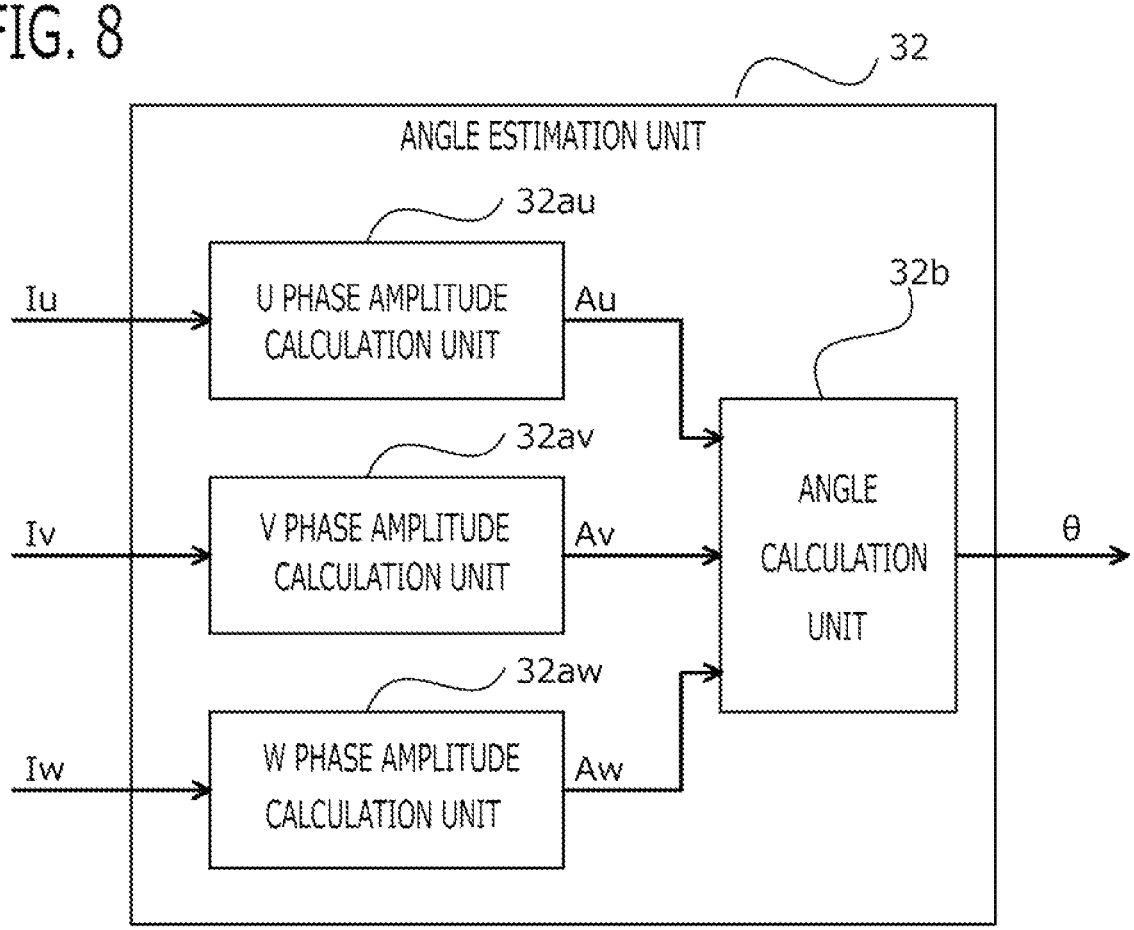
FIG. 8 is a schematic block diagram of the angle estimation unit according to Embodiment 1.

As shown in FIG. 8, the angle estimation unit 32 is provided with amplitude calculation units of respective phases of three-phase 32au, 32av, 32aw, and the angle calculation unit 32b.

The amplitude calculation unit of U phase 32au extracts the frequency component Ihu of the voltage command for estimation from the current detection value of U phase Iu, and calculates the amplitude Au of the frequency component of the voltage command for estimation included in U phase current, based on the frequency component Ihu. The amplitude calculation unit of V phase 32av extracts the frequency component Ihv of the voltage command for estimation from the current detection value of V phase Iv, and calculates the amplitude Av of the frequency component of the voltage command for estimation included in V phase current, based on the frequency component Ihv. The amplitude calculation unit of W phase 32aw extracts the frequency component Ihw of the voltage command for estimation from the current detection value of W phase Iw, and calculates the amplitude Aw of the frequency component of the voltage command for estimation included in W phase current, based on the frequency component Ihw.

As the extracting processing of the frequency component, a band pass filter processing which passes the component of the frequency fh of the voltage command for estimation, and attenuates components other than the frequency fh of the voltage command for estimation may be used. As the calculation processing of the amplitude, an autocorrelation integral may be used, or a difference between the maximum value and the minimum value may be simply calculated as the amplitude. Alternatively, as the extracting processing of the frequency component and the calculation processing of the amplitude, a Fourier transform which extracts only the frequency fh of the voltage command for estimation may be used.

Alternatively, as shown in the current detection value of U phase Iu of FIG. 7, the amplitude Au of the frequency component Ihu of the voltage command for estimation is proportional to a difference between two current detection values detected in the one period Th of the voltage command for estimation. Then, the amplitude calculation unit of each phase of three-phase 32au, 32av, 32aw may calculate the difference between two current detection values detected in the one period Th of the voltage command for estimation, and may calculate the difference of the current detection values, as the amplitude of the frequency component of the voltage command for estimation included in current.

Figure 9:
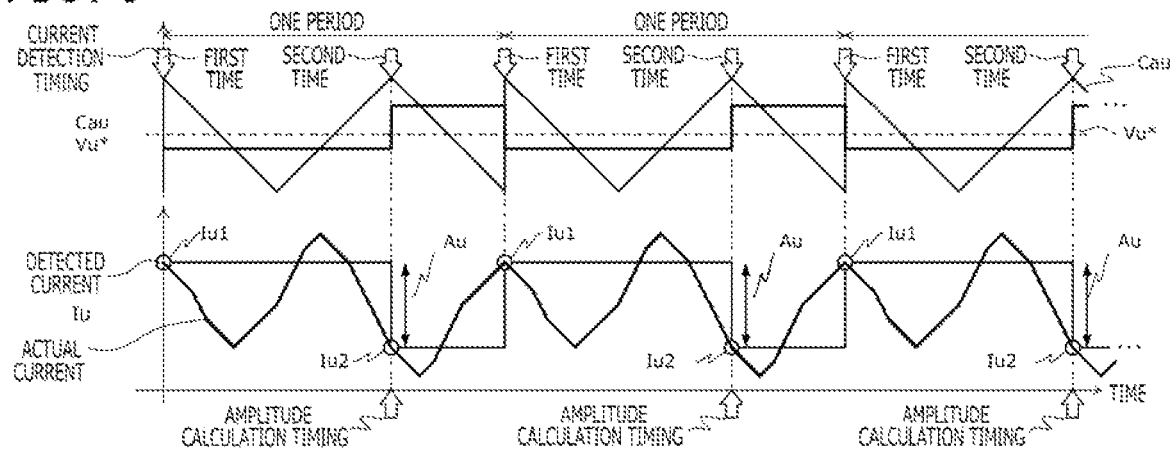
FIG. 9 is a time chart for explaining the voltage command for estimation of U phase, the carrier wave, and the behavior of current detection value according to Embodiment 1.

For example, as FIG. 9 shows an example of the current detection value of U phase Iu, at the second current detection timing in the one period Th of the voltage command for estimation, the amplitude calculation unit of U phase 32au calculates an absolute value of a value obtained by subtracting the current detection value of U phase Iu1 detected at the first current detection timing from the current detection value of U phase Iu2 detected at the second current detection timing, as the amplitude Au of the frequency component of the voltage command for estimation included in U phase current (Au=|Iu1−Iu2|).

Then, the angle calculation unit 32b estimates the magnetic pole position θ, based on the amplitudes Au, Av, Aw of the frequency components of the voltage command for estimation included in currents of respective phases of three-phase. For example, the angle calculation unit 32b may convert the amplitudes Au, Av, Aw of three-phase into amplitudes of two-phase, and calculate the magnetic pole position θ by performing the arc tangent calculation of the amplitudes of two-phase. Alternatively, the angle calculation unit 32b may calculate the magnetic pole position θ by performing the inverse cosine calculation to any one of the amplitudes Au, Av, Aw of three-phase. Alternatively, the angle calculation unit 32b may calculate the three magnetic pole positions θ by performing the inverse cosine calculation to each of the amplitudes Au, Av, Aw of three-phase, and calculate an average value of the three magnetic pole positions θ, as the final magnetic pole position θ.

2. Embodiment 2

Next, the controller 10 for the rotary electric machine according to Embodiment 2 will be explained. The explanation for constituent parts the same as those in Embodiment 1 will be omitted. The basic configuration of the controller 10 according to the present embodiment is the same as that of Embodiment 1. The configuration of the command for estimation generation unit 35 is different from Embodiment 1.

Figure 10:
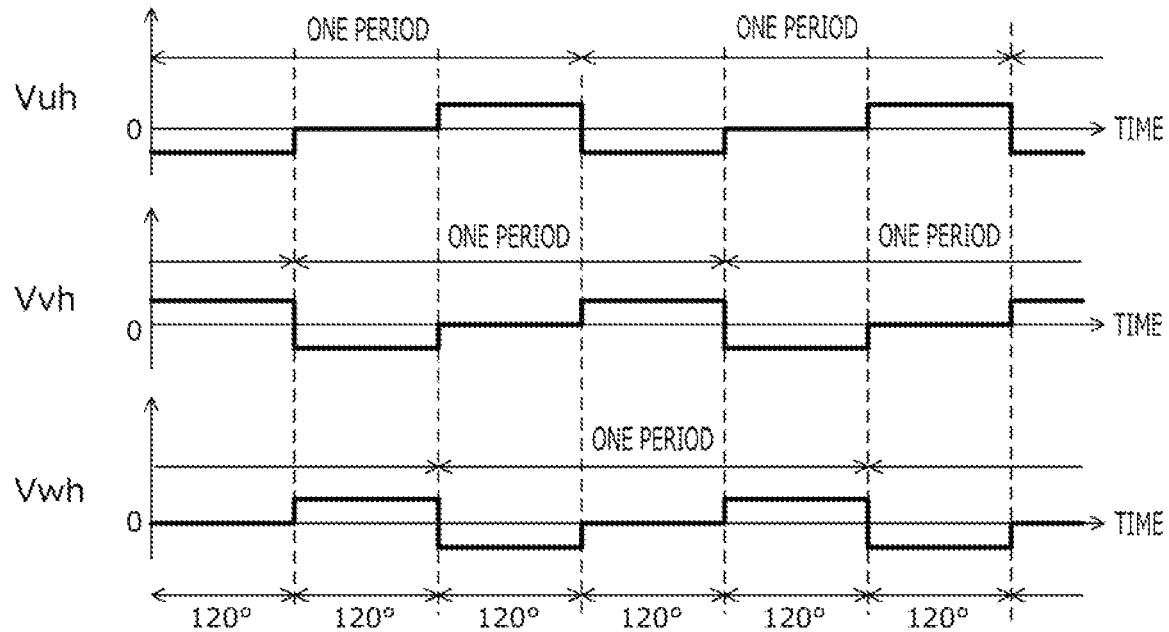
FIG. 10 is a time chart of the voltage commands for estimation of three-phase according to Embodiment 2.

As shown in FIG. 10, similar to Embodiment 1, the one period Th of the voltage command for estimation is equally divided into three which is the necessary minimum division number. However, unlike Embodiment 1, in the present embodiment, in the three division periods, each of the voltage commands for estimation is set so that the values of three division periods are different with each other. Each division period is 120 degrees period, the voltage commands for estimation are shifted by one division period mutually among phases.

Similar to Embodiment 1, at each time, it is set so that a total value of the voltage commands for estimation of three-phase Vuh, Vvh, Vwh becomes 0. And, it is set so that an integral value of each of the voltage commands for estimation in the one period becomes 0.

In the example of FIG. 10, within the one period Th of the voltage command for estimation, the voltage command for estimation of the second division period is set to 0, the voltage command for estimation of the first division period is set to a negative value, and the voltage command for estimation of the third division period is set to a positive/negative reversing value (a positive value) of the negative value of the first division period. As long as the total value of three-phase becomes 0 and the integral value of one period of each phase becomes 0, the value of each division period may be replaced.

Figure 11:
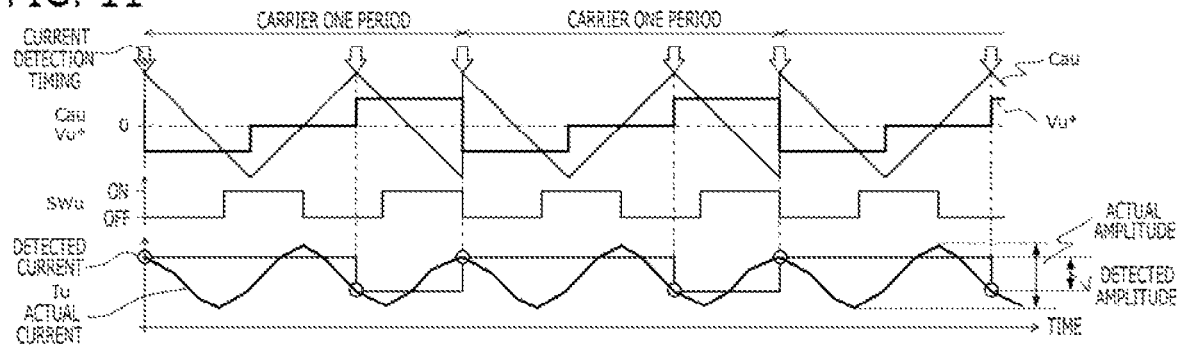
FIG. 11 is a time chart for explaining the behavior of the current detection value with respect to the phase setting of the voltage command for estimation and the carrier wave according to Embodiment 2.
Figure 12:
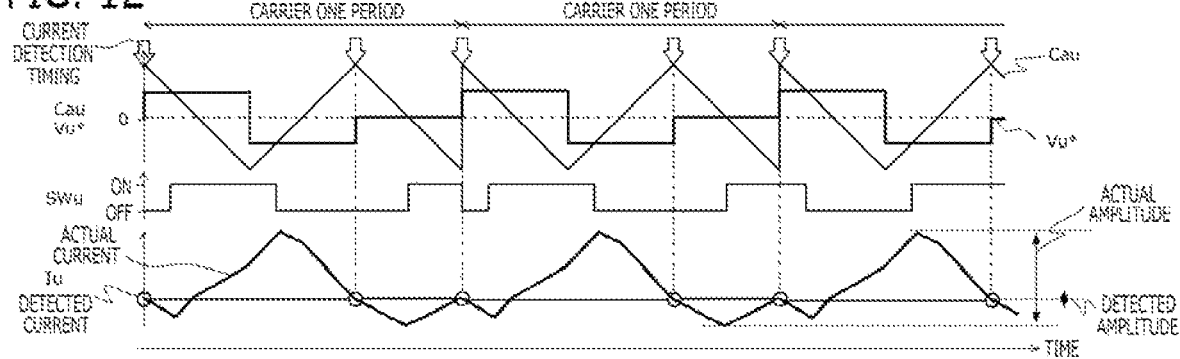
FIG. 12 is a time chart for explaining the behavior of the current detection value with respect to the phase setting of the voltage command for estimation and the carrier wave according to Embodiment 2.
Figure 13:
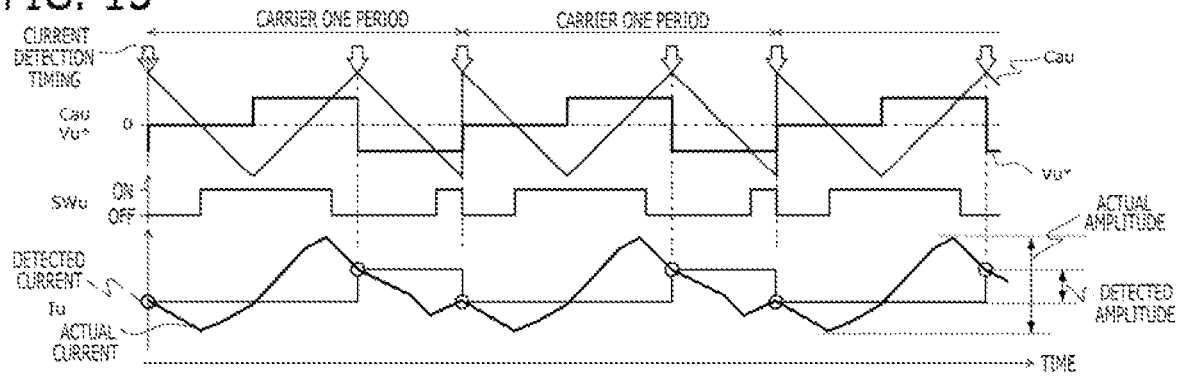
FIG. 13 is a time chart for explaining the behavior of the current detection value with respect to the phase setting of the voltage command for estimation and the carrier wave according to Embodiment 2.

Similar to Embodiment 1, the carrier generation unit 37 generates a triangular wave of 1.5 periods which starts from the peak point of mountain and ends at the bottom point of valley, as the carrier wave of the one period Th. The example of the control behavior of U phase is shown in FIG. 11, FIG. 12, and FIG. 13. Among FIG. 11 to FIG. 13, the phases of the voltage command for estimation with respect to the carrier wave are mutually different by 120 degrees.

As shown in FIG. 11 to FIG. 13, if the phases of the voltage command for estimation with respect to the carrier wave are different, the waveforms of PWM control signal of U phase SWu are different, and the waveforms of the frequency component of the voltage command for estimation superimposed on U phase current are also different. Accordingly, the magnitudes of the difference between two current detection values detected in the one period Th of the voltage command for estimation are different. As the difference between two current detection values becomes larger, the noise resistance becomes higher. Accordingly, the setting of the phase difference of FIG. 11 or FIG. 13 is more desirable than the setting of the phase difference of FIG. 12. Therefore, by setting the carrier wave, the waveform of the voltage command for estimation, and the relative phase in accordance with the electrical characteristics of the rotary electric machine, the difference between the two current detection values can be enlarged and the noise resistance can be increased.

3. Embodiment 3

Next, the controller 10 for the rotary electric machine according to Embodiment 3 will be explained. The explanation for constituent parts the same as those in Embodiment 1 will be omitted. The basic configuration of the controller 10 according to the present embodiment is the same as that of Embodiment 1. The configuration of the carrier generation unit 37 is different from Embodiment 1.

Figure 14:
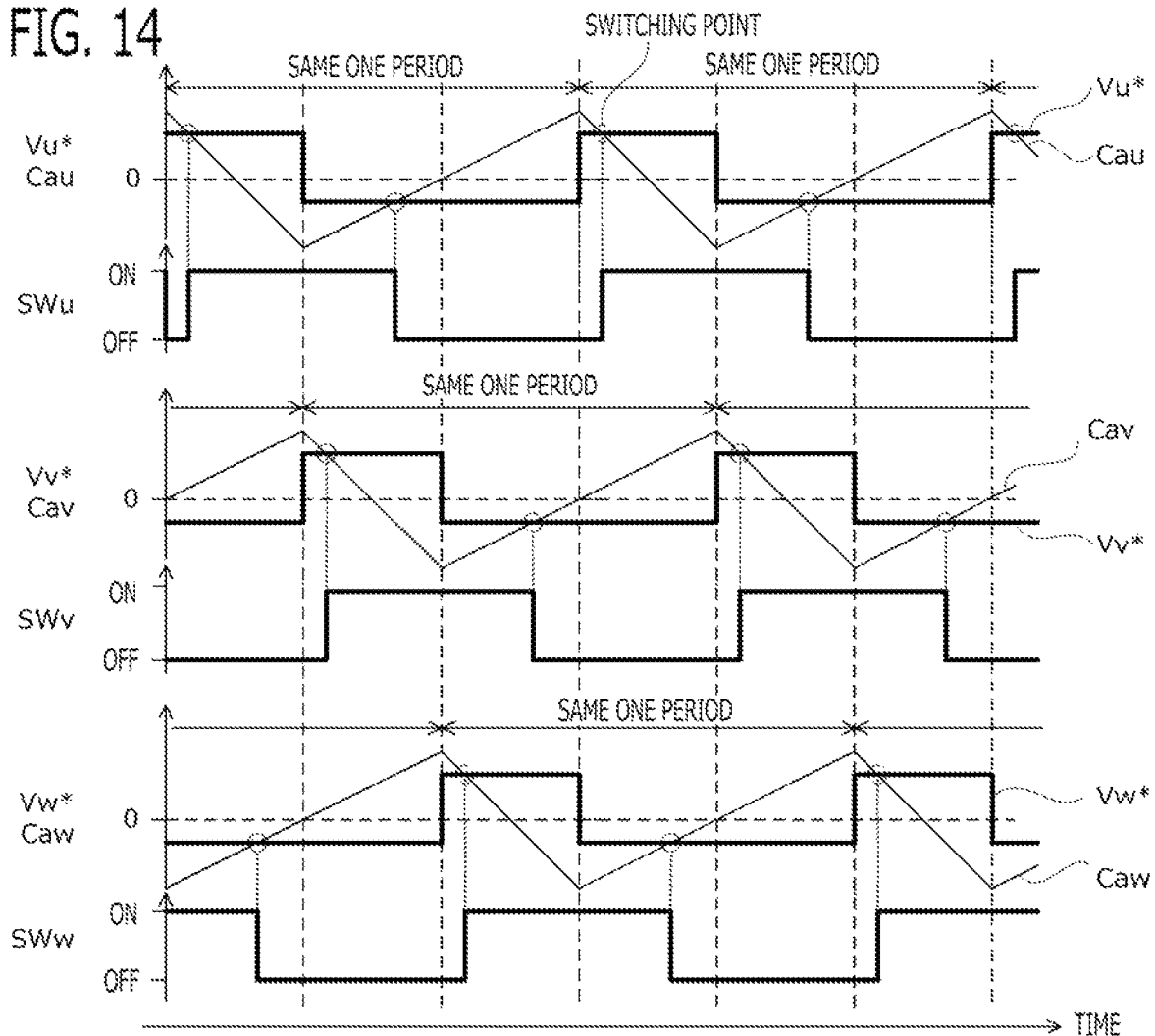
FIG. 14 is a time chart for explaining generation of the PWM control signal by comparing the voltage command for estimation with the carrier wave according to Embodiment 3.

In the present embodiment, as shown in FIG. 14, the carrier generation unit 37 generates an asymmetric triangular wave of one period, as the carrier wave of the one period Th. The asymmetric triangular wave is a triangular wave in which the inclination of increase and the inclination of decrease are different. In Embodiments 1 and 2, the symmetrical triangular wave is used and the inclination of increase and the inclination of decrease are the same. The carrier waves of three-phase Cau, Cav, Caw have a mutual phase difference of ⅓ of the one period Th of the carrier wave among phases.

In Embodiment 1, the switching frequency per the one period Th of the voltage command for estimation is 4 times. In the present embodiment, the switching frequency per the one period Th of the voltage command for estimation is twice. By further reducing the switching frequency, the switching loss and the electromagnetic noise generated by switching can further be reduced.

Figure 15:
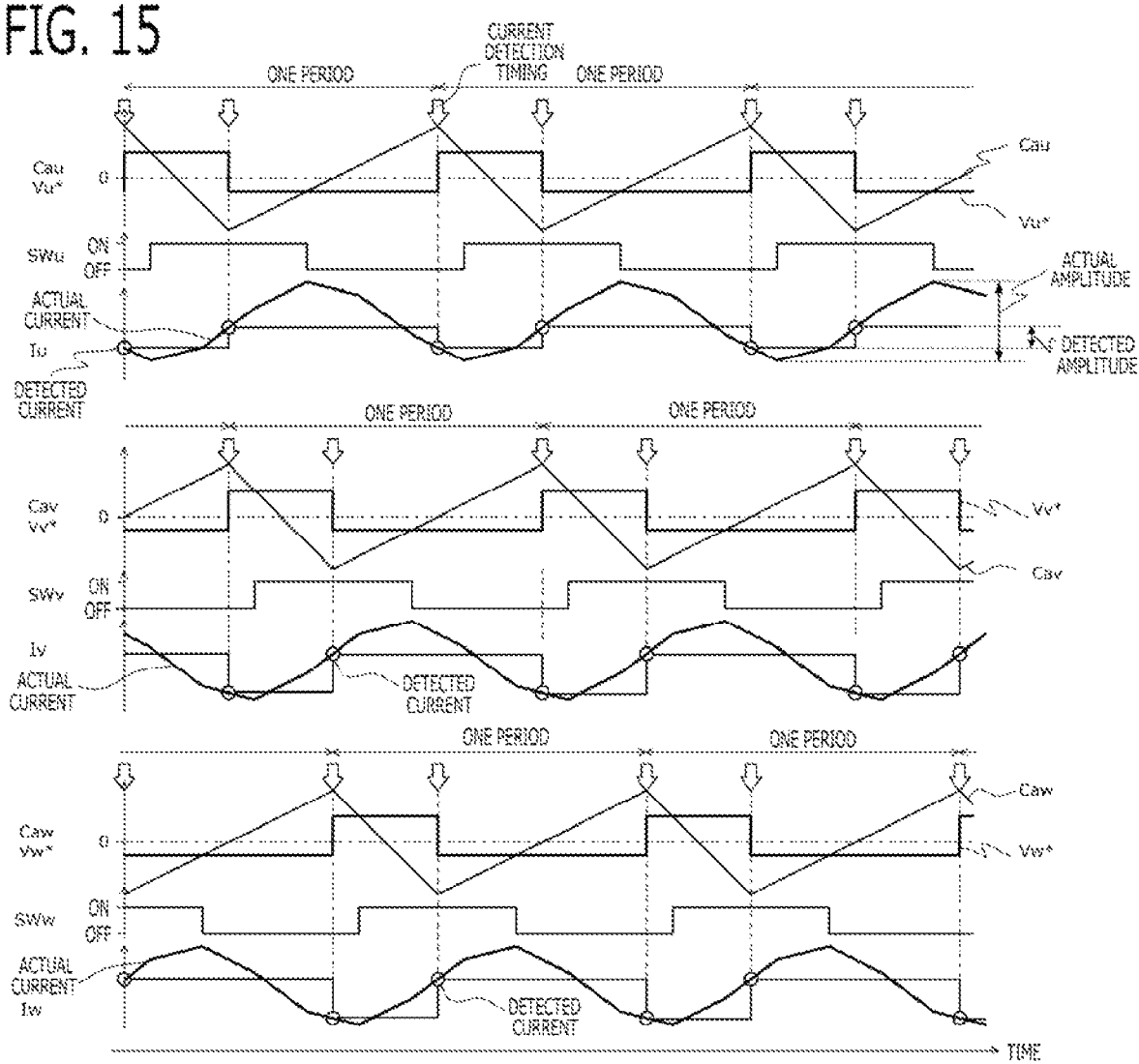
FIG. 15 is a time chart for explaining the voltage command for estimation, the carrier wave, and the behavior of current detection value according to Embodiment 3.

As FIG. 15 shows the behavior of current detection, in the present embodiment, the current detection unit 31 detects the current Iu, Iv, Iw of each phase at both of the peak point of mountain and the bottom point of valley of the carrier wave of each phase, based on the output signal of the current sensor 4 of each phase.

In the present embodiment, the current sensor 4 is provided on the each phase wire which connects the series circuit of the switching devices and the winding. Regardless of the period when the switching device is turned on, current can be detected at any timing. Alternatively, in addition to the negative electrode side of the negative electrode side switching device 22a, the current sensor 4 may be provided also on the positive electrode side of the positive electrode side switching device 22a.

The current detection frequency in the one period Th of the voltage command for estimation can be maintained at twice even if the switching frequency is reduced. Accordingly, similarly to Embodiment 1, the frequency component of the one period Th of the voltage command for estimation can be extracted from the current detection value (in this example, the difference between two current detection values in the one period Th of the voltage command for estimation is calculated), and the rotational angle θ can be estimated.

Figure 16:
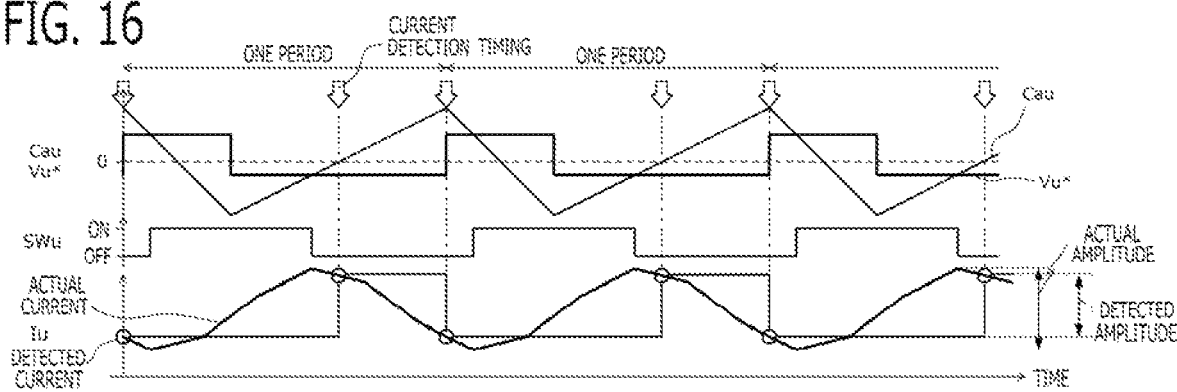
FIG. 16 is a time chart for explaining the voltage command for estimation of U phase, the carrier wave, and the behavior of current detection value according to Embodiment 3.

Alternatively, even if the current sensor 4 is provided only on the negative electrode side of the negative electrode side switching device 22a, as FIG. 16 shows the behavior of current detection of U phase, if current is detected twice in the period when the PWM control signal is turned off and the negative electrode side switching device 22b is turned off, current is detected twice in the one period Th of the voltage command for estimation. Accordingly, the frequency component of the one period Th of the voltage command for estimation can be extracted, and the rotational angle θ can be estimated.

The controller for rotary electric machine 10 of each embodiment mentioned above may be applied to a controller for electric power steering which assists steering of vehicle. Also in this case, without using the angle sensor, the rotational angle of the rotor can be estimated and the output torque of the rotary electric machine can be controlled. Even if the voltage command for estimation is superimposed, it can be suppressed that the noise increases and the switching frequency increases. Therefore, inexpensive and comfortable electric power steering can be obtained.

The controller for rotary electric machine 10 of each embodiment mentioned above may be applied to a controller for rotary electric machine for driving or power generating of an electric vehicle or a hybrid vehicle. Also in this case, the efficient rotary electric machine which can suppress the increase in switching loss can be obtained similarly. Alternatively, the controller for rotary electric machine 10 may control a rotary electric machine of various applications.

Although the present disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

REFERENCE SIGNS LIST

1 Rotary Electric Machine, 2 Inverter, 4 Current Sensor, 10 Controller for Rotary Electric Machine, 22a Positive Electrode Side Switching Device, 22b Negative Electrode Side Switching Device, 25 DC Power Source, 31 Current Detection Unit, 32 Angle Estimation Unit, 33 Voltage Detection Unit, 34 Current Control Unit, 35 Command for Estimation Generation Unit, 36 Voltage Command Calculation Unit, 37 Carrier Generation Unit, 38 Voltage Application Unit, Cau, Cav, Caw Carrier Waves of Three-phase, Vuh, Vvh, Vwh Voltage Commands for Estimation of Three-phase, θ Rotational Angle (Magnetic Pole Position), fh Frequency of Voltage Command for Estimation, ωh Angular Frequency of Voltage Command for Estimation

What is claimed is:

1. A controller for rotary electric machine which controls a rotary electric machine which has saliency in a rotor via an inverter, the controller for rotary electric machine comprising at least one processor configured to implement:

a current detector that detects current which flow into a winding provided in a stator of the rotary electric machine;

an angle estimator that estimates a rotational angle of the rotor, based on current detection value;

a current controller that calculates a driving voltage command for driving the rotary electric machine, based on the current detection value;

a command for estimation generator that generates a voltage command for estimation;

a voltage command calculator that calculates a voltage command by adding the voltage command for estimation to the driving voltage command on a stationary coordinate system fixed to the winding;

a carrier generator that generates a carrier wave; and a voltage applicator that turns on and off switching devices which the inverter has and applies voltage to the winding, based on a comparison result between the voltage command and the carrier wave, wherein the command for estimation generator generates the voltage command for estimation of a preliminarily set one period on the stationary coordinate system fixed to the winding, wherein the carrier generator generates the carrier wave of the same one period as the one period of the voltage command for estimation, and wherein the angle estimator extracts a frequency component of the one period of the voltage command for estimation, from the current detection value, on the stationary coordinate system fixed to the winding, and estimates the rotational angle based on the frequency component.

2. The controller for rotary electric machine according to claim 1, wherein the winding is windings of three-phase, wherein the carrier generator generates the three carrier waves corresponding to respective phases of three-phase, and the three carrier waves have a mutual phase difference of ⅓ of the one period of the carrier waves among phases, wherein the command for estimation generator generates the three voltage commands for estimation corresponding to respective phases of three-phase, and the three voltage commands for estimation have a mutual phase difference of ⅓ of the one period of the voltage command for estimation among phases.

3. The controller for rotary electric machine according to claim 1, wherein the carrier generator generates a triangular wave comprising a first falling waveform, a rising waveform followed by a second falling waveform, wherein the triangular wave starts from a peak point of the first falling waveform and ends at a bottom point of the second falling waveform, and wherein the triangular wave from the peak point of the first falling waveform to the bottom point of the second falling waveform is the carrier wave of one period, or generates a triangular wave comprising a first rising waveform, a falling waveform followed by a second rising waveform, wherein the triangular wave starts from a bottom point of the first rising waveform and ends at a peak point of the second rising waveform, and wherein the triangular wave from the bottom point of the first rising waveform to the peak point of the second rising waveform is the carrier wave of one period.

4. The controller for rotary electric machine according to claim 1,
 wherein the current detector detects the current at least twice in the one period of the carrier wave.

5. The controller for rotary electric machine according to claim 1,
 wherein a current sensor is provided on a series circuit of a positive electrode side switching device and a negative electrode side switching device of the inverter, and
 wherein when the positive electrode side switching device or the negative electrode side switching device is turned on, the current detector detects the current based on the output signal of the current sensor.

6. The controller for rotary electric machine according to claim 1,
 wherein the winding is windings of three-phase,
 wherein the command for estimation generator generates the three voltage commands for estimation corresponding to respective phases of three-phase,
 the three voltage commands for estimation have a mutual phase difference of $1/3$ of the one period of the voltage command for estimation among phases, and
 in three division periods obtained by equally dividing the one period of the voltage command for estimation into three, each of the voltage commands for estimation is set so that values of at least the two division periods are different with each other.

7. The controller for rotary electric machine according to claim 1,
 wherein a frequency of the one period of the voltage command for estimation is greater than or equal to 18000 Hz.

* * * * *